United States Patent [19]
Tutt et al.

[11] Patent Number: 5,698,366
[45] Date of Patent: Dec. 16, 1997

[54] METHOD FOR PREPARATION OF AN IMAGING ELEMENT

[75] Inventors: Lee William Tutt, Webster; Gerald Thomas Frizelle, Marion; Linda Kaszczuk, Webster, all of N.Y.

[73] Assignee: Eastman Kodak Company, Rochester, N.Y.

[21] Appl. No.: 720,261

[22] Filed: Sep. 26, 1996

Related U.S. Application Data

[63] Continuation of Ser. No. 455,323, May 31, 1995, abandoned.

[51] Int. Cl.$^6$ .................... B41M 1/18; B44C 3/02
[52] U.S. Cl. .................. 430/258; 101/467; 101/471; 156/234; 156/235; 156/240; 156/247; 156/272.2; 156/272.8; 430/200; 430/201; 430/945; 430/293; 430/302
[58] Field of Search .................. 101/467, 470, 101/471; 156/230, 233, 235, 240, 247, 272.2, 272.8; 430/201, 200, 293, 256, 258, 253, 254, 262, 263, 302, 303, 306, 945

[56] References Cited

U.S. PATENT DOCUMENTS

| | | | |
|---|---|---|---|
| 3,549,733 | 12/1970 | Caddell | 101/401.1 |
| 3,574,657 | 4/1971 | Burnett | 430/302 |
| 3,793,033 | 2/1974 | Mukherjee | 101/456 |
| 3,832,948 | 9/1974 | Barker | 101/453 |
| 3,962,513 | 6/1976 | Eames | 101/463 |
| 3,964,389 | 6/1976 | Peterson | 430/200 |
| 4,034,183 | 7/1977 | Uhlig | 219/122 |
| 4,054,094 | 10/1977 | Caddell et al. | 101/467 |
| 4,123,578 | 10/1978 | Derrington et al. | 430/200 |
| 4,157,412 | 6/1979 | Deneau | 430/200 |
| 4,334,006 | 6/1982 | Kitajima et al. | 430/254 |
| 4,693,958 | 9/1987 | Schwartz et al. | 430/302 |
| 4,731,317 | 3/1988 | Fromson et al. | 430/945 |
| 5,006,189 | 4/1991 | Tsukamoto et al. | 156/247 |
| 5,021,112 | 6/1991 | Breger | 101/211 |
| 5,155,003 | 10/1992 | Chang | 430/253 |
| 5,168,288 | 12/1992 | Baek et al. | 346/762 |
| 5,171,650 | 12/1992 | Ellis et al. | 430/201 |
| 5,238,778 | 8/1993 | Hirai et al. | 430/200 |
| 5,353,705 | 10/1994 | Lewis et al. | 101/453 |
| 5,364,412 | 11/1994 | Furukawa | 8/467 |
| 5,385,092 | 1/1995 | Lewis et al. | 101/467 |
| 5,387,496 | 2/1995 | DeBoer | 430/945 |
| 5,395,729 | 3/1995 | Reardon et al. | 430/200 |
| 5,468,591 | 11/1995 | Pearce et al. | 430/201 |
| 5,521,035 | 5/1996 | Wolk et al. | 430/200 |

FOREIGN PATENT DOCUMENTS

| | | | |
|---|---|---|---|
| 0 001 068 | 3/1979 | European Pat. Off. | |
| 0353121 | 1/1990 | European Pat. Off. | 156/240 |
| 0 573 091 | 12/1993 | European Pat. Off. | |

*Primary Examiner*—Martin Angebranndt
*Attorney, Agent, or Firm*—J. Lanny Tucker

[57] ABSTRACT

Imaging elements are prepared by a method in which an image is generated on a donor element and then transferred from the donor element to a receiver element by the steps of lamination and peeling. The donor element comprises a support, an image-forming layer and optional release and adhesive layers and the image is formed by imagewise laser-induced thermal ablation of the image-forming layer. The method is particularly useful for the preparation of lithographic printing plates as it avoids the need to employ alkaline developing solutions.

24 Claims, No Drawings

METHOD FOR PREPARATION OF AN IMAGING ELEMENT

This is a continuation of application Ser. No. 08/455,323, filed 31 May 1995, now abandoned.

FIELD OF THE INVENTION

This invention relates in general to imaging elements and in particular to a novel method for the preparation of imaging elements. More specifically, this invention relates to a method for the preparation of an imaging element in which an image is generated on a first element and then transferred from the first element to a second element by the steps of lamination and peeling. The method of the invention finds particular utility in the preparation of lithographic printing plates but can also be utilized in other related technological areas such as in the manufacture of printed circuit boards.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced, such as paper, cloth and the like. Commonly the ink is transferred to an intermediate material called the blanket, which in turn transfers the ink to the surface of the material upon which the image is to be reproduced.

Aluminum has been used for many years as a support for lithographic printing plates. In order to prepare the aluminum for such use, it is typical to subject it to both a graining process and a subsequent anodizing process. The graining process serves to improve the adhesion of the subsequently applied radiation-sensitive coating and to enhance the water-receptive characteristics of the background areas of the printing plate. The graining affects both the performance and the durability of the printing plate, and the quality of the graining is a critical factor determining the overall quality of the printing plate. A fine, uniform grain that is free of pits is essential to provide the highest quality performance.

Both mechanical and electrolytic graining processes are well known and widely used in the manufacture of lithographic printing plates. Optimum results are usually achieved through the use of electrolytic graining, which is also referred to in the art as electrochemical graining or electrochemical roughening, and there have been a great many different processes of electrolytic graining proposed for use in lithographic printing plate manufacturing. Processes of electrolytic graining are described, for example, in U.S. Pat. Nos. 3,755,116, 3,887,447, 3,935,080, 4,087,341, 4,201,836, 4,272,342, 4,294,672, 4,301,229, 4,396,468, 4,427,500, 4,468,295, 4,476,006, 4,482,434, 4,545,875, 4,548,683, 4,564,429, 4,581,996, 4,618,405, 4,735,696, 4,897,168 and 4,919,774.

In the manufacture of lithographic printing plates, the graining process is typically followed by an anodizing process, utilizing an acid such as sulfuric or phosphoric acid, and the anodizing process is typically followed by a process which renders the surface hydrophilic such as a process of thermal silication or electrosilication. The anodization step serves to provide an anodic oxide layer and is preferably controlled to create a layer of at least 0.3 $g/m^2$. Processes for anodizing aluminum to form an anodic oxide coating and then hydrophilizing the anodized surface by techniques such as silication are very well known in the art, and need not be further described herein.

Included among the many patents relating to processes for anodization of lithographic printing plates are U.S. Pat. Nos. 2,594,289, 2,703,781, 3,227,639, 3,511,661, 3,804,731, 3,915,811, 3,988,217, 4,022,670, 4,115,211, 4,229,266 and 4,647,346. Illustrative of the many materials useful in forming hydrophilic barrier layers are polyvinyl phosphonic acid, polyacrylic acid, polyacrylamide, silicates, zirconates and titanates. Included among the many patents relating to hydrophilic barrier layers utilized in lithographic printing plates are U.S. Pat. Nos. 2,714,066, 3,181,461, 3,220,832, 3,265,504, 3,276,868, 3,549,365, 4,090,880, 4,153,461, 4,376,914, 4,383,987, 4,399,021, 4,427,765, 4,427,766, 4,448,647, 4,452,674, 4,458,005, 4,492,616, 4,578,156, 4,689,272, 4,935,332 and European Patent No. 190,643.

The result of subjecting aluminum to an anodization process is to form an oxide layer which is porous. Pore size can vary widely, depending on the conditions used in the anodization process, but is typically in the range of from about 0.1 to about 10 micrometers. The use of a hydrophilic barrier layer is optional but preferred. Whether or not a barrier layer is employed, the aluminum support is characterized by having a porous wear-resistant hydrophilic surface which specifically adapts it for use in lithographic printing, particularly in situations where long press runs are required.

A wide variety of radiation-sensitive materials suitable for forming images for use in the lithographic printing process are known. Any radiation-sensitive layer is suitable which, after exposure and any necessary developing and/or fixing, provides an area in imagewise distribution which can be used for printing.

Useful negative-working compositions include those containing diazo resins, photocrosslinkable polymers and photopolymerizable compositions. Useful positive-working compositions include aromatic diazooxide compounds such as benzoquinone diazides and naphthoquinone diazides.

Lithographic printing plates of the type described hereinabove are usually developed with a developing solution after being imagewise exposed. The developing solution, which is used to remove the non-image areas of the imaging layer and thereby reveal the underlying porous hydrophilic support, is typically an aqueous alkaline solution and frequently includes a substantial amount of organic solvent. The need to use and dispose of substantial quantities of alkaline developing, solution has long been a matter of considerable concern in the printing art.

Efforts have been made for many years to manufacture a printing plate which does not require development with an alkaline developing solution. Examples of the many patents and published patent applications relating to such prior efforts include:

(1) Caddell, U.S. Pat. No. 3,549,733, issued Dec. 22, 1970.

This patent describes a method for producing a printing plate in which a polymeric surface layer is subjected to a controlled laser beam of sufficient intensity to decompose the layer and form depressions in the surface of the plate.

(2) Burnett, U.S. Pat. No. 3,574,657, issued Apr. 13, 1971.

This patent describes a method for producing a printing plate in which an image is formed by exposing a cured allylic resin coating to a heat pattern.

(3) Mukherjee, U.S. Pat. No. 3,793,033, issued Feb. 19, 1974.

This patent describes a lithographic printing plate comprising a support and a hydrophilic imaging layer comprising a phenolic resin, an hydroxyethylcellulose ether and a photoinitiator. Upon imagewise exposure, the imaging layer becomes oleophilic in the exposed areas while remaining hydrophilic in the unexposed areas and thus can be used on a lithographic printing press, utilizing conventional inks and fountain solutions, without the need for a development step and consequently without the need for a developing solution.

(4) Barker, U.S. Pat. No. 3,832,948, issued Sep. 3, 1974.

This patent describes a method for producing a printing plate in which a surface in relief is formed by scanning coherent radiation over the surface of a radiation-absorptive thin film supported by a plastic substrate.

(5) Eames, U.S. Pat. No. 3,962,513, issued Jun. 8, 1976.

This patent describes a method for producing a printing plate in which a transfer film comprising a transparent substrate, a layer comprising particles which absorb laser energy, and a layer of ink receptive resin is exposed with a laser beam to effect transfer to a lithographic surface.

(6) Peterson, U.S. Pat. No. 3,964,389, issued Jun. 22, 1976.

This patent describes a method for producing a printing plate in which a transfer film comprising a transparent substrate and a layer comprising particles which absorb laser energy is exposed with a laser beam to effect transfer to a lithographic surface.

(7) Uhlig, U.S. Pat. No. 4,034,183, issued Jul. 5, 1977.

This patent describes a lithographic printing plate comprising a support and a hydrophilic imaging layer that is imagewise exposed with laser radiation to render the exposed areas oleophilic and thereby form a lithographic printing surface. The printing plate can be used on a lithographic printing press employing conventional inks and fountain solutions without the need for a development step. If the hydrophilic imaging layer is water-insoluble, the unexposed areas of the layer serve as the image background. If the hydrophilic imaging layer is water-soluble the support which is used must be hydrophilic and then the imaging layer is removed in the unexposed areas by the fountain solution to reveal the underlying hydrophilic support.

(8) Caddell et al, U.S. Pat. No. 4,054,094, issued Oct. 18, 1977.

This patent describes a lithographic printing plate comprised of a support, a polymeric layer on the support, and a thin top coating of a hard hydrophilic material on the polymeric layer. A laser beam is used to etch the surface of the plate, thereby rendering it capable of accepting ink in the etched regions and accepting water in the unetched regions.

(9) Kitajima et al, U.S. Pat. No. 4,334,006, issued Jun. 8, 1982.

This patent describes a method for forming an image in which a photosensitive material composed of a support and a layer of a photosensitive composition is exposed and developed by heating in intimate contact with a peeling development carrier sheet and subsequently peeling the carrier sheet from the photosensitive material.

(10) Schwartz et al, U.S. Pat. No. 4,693,958, issued Sep. 15, 1987.

This patent describes a lithographic printing plate comprising a support and a hydrophilic water-soluble heat-curable imaging layer which is imagewise exposed by suitable means, such as the beam of an infrared laser, to cure it and render it oleophilic in the exposed areas. The uncured portions of the imaging layer can then be removed by merely flushing with water.

(11) Fromson et al, U.S. Pat. No. 4,731,317, issued Mar. 15, 1988.

This patent describes a lithographic printing plate comprising a grained and anodized aluminum substrate having thereon a coating comprising a diazo resin in admixture with particulate energy-absorbing material that will absorb incident radiation and re-radiate it as radiation that will change the diazo resin coating.

(12) Hirai et al, U.S. Pat. No. 5,238,778, issued Aug. 24, 1993.

This patent describes a method of preparing a lithographic printing plate utilizing an element comprising a support having thereon a heat transfer layer containing a colorant, a heat-fusible substance and a photo-curable composition. Heat is applied in an image pattern to transfer the image onto a recording material having a hydrophilic surface and the transferred image is exposed to actinic radiation to cure it.

(13) Lewis et al, U.S. Pat. No. 5,353,705, issued Oct. 11, 1994.

This patent describes lithographic printing plates, suitable for imaging by means of laser devices which ablate one or more layers, which include a secondary ablation layer that ablates only partially as a result of destruction of overlying layers.

(14) Lewis et al, U.S. Pat. No. 5,385,092, issued Jan. 31, 1994.

This patent describes lithographic printing plates intended to be imaged by means of laser devices that emit in the infrared region. Both wet plates that utilize fountain solution during printing and dry plates to which ink is applied directly are described. Laser output either ablates one or more layers or physically transforms a surface layer whereby exposed areas exhibit an affinity for ink or an ink-abhesive fluid, such as fountain solution, that differs from that of unexposed areas.

(15) Reardon et al, U.S. Pat. No. 5,395,729, issued Mar. 7, 1995.

This patent describes a laser-induced thermal transfer process useful in applications such as color proofing and lithography. In this process, an assemblage comprising a donor element and a receiver element is imagewise exposed to laser radiation, the donor element is separated from the receiver element, and the receiver element is subjected to a post-transfer treatment to substantially eliminate back-transfer.

(16) European Patent Application No. 0 001 068, published Mar. 21, 1979.

This patent application describes a process for preparing a lithographic printing plate by providing an aluminum substrate having a hydrophilic porous anodic oxide layer thereon and depositing an oleophilic image in and on the porous layer by sublimation.

(17) European Patent Application No. 0 573 091, published Dec. 8, 1993.

This patent application describes a lithographic printing plate comprising a support having an oleophilic surface, a recording layer that is capable of converting laser beam radiation into heat, and an oleophobic surface layer. The recording layer and the oleophobic surface layer can be the same layer or separate layers. The printing plate is imagewise exposed with a laser beam and is then rubbed to remove the oleophobic surface layer in the exposed areas so as to reveal the underlying oleophilic surface and thereby form a lithographic printing surface.

Lithographic printing plates designed to eliminate the need for a developing solution which have been proposed heretofore have suffered from one or more disadvantages which have limited their usefulness. For example, they have lacked a sufficient degree of discrimination between oleophilic image areas and hydrophilic non-image areas with the result that image quality on printing is poor, or they have had oleophilic image areas which are not sufficiently durable to permit long printing runs, or they have had hydrophilic non-image areas that are easily scratched and worn, or they have been unduly complex and costly by virtue of the need to coat multiple layers on the support.

It is toward the objective of providing an improved method of making an imaging element, such as a lithographic printing plate, that requires no alkaline developing solution, that is simple and inexpensive, and which overcomes many of the limitations and disadvantages of the prior art that the present invention is directed.

SUMMARY OF THE INVENTION

In accordance with this invention, an imaging element is prepared by a method comprising the steps of:

(1) providing a first element which serves as an image-donating element, the first element comprising a support and an image-forming layer which is infrared-absorptive;

(2) providing a second element which serves as an image-receiving element;

(3) generating an image on the first element by imagewise laser-induced thermal ablation of the image-forming layer; and (4) transferring the image from the first element to the second element by the steps of lamination and peeling.

In one embodiment of the invention, the imaging element produced is a lithographic printing plate. This embodiment requires that the image-forming layer be both oleophilic and infrared-absorptive and that the image-receiving element has a hydrophilic surface to which the image is transferred. A preferred imaging-receiving element for use in this embodiment is an aluminum substrate which has been both grained and anodized to provide a durable hydrophilic surface.

In a second embodiment of the invention, the imaging element is one which is utilized in the manufacture of printed circuit boards. In this process, the image is transferred to a metal or metal-coated substrate and serves as a mask to enable a subsequent etching step to be conducted.

In particularly preferred embodiments of the invention, the image-donating element does not comprise just a support and an image-forming layer but also includes one or both of a release layer which is interposed between the support and the image-forming layer and an adhesive layer which overlies the image-forming layer. The function of the release layer is to facilitate peeling of the support from the image after the lamination step while the function of the adhesive layer is to enhance the bonding of the image to the image-receiving element.

The invention provides the important advantage that the image-donating element can be flexible, and thus capable of being wrapped around a drum to facilitate laser imaging, while the image-receiving element can be flexible, semi-rigid or rigid as desired. The support for the image-donating element serves only a temporary function and is suitably prepared from relatively low cost dimensionally-stable flexible materials such as polyester films. The nature of the image-receiving element depends on the product being prepared and such element can be, for example, a conventional lithographic substrate such as grained and anodized aluminum, a printed circuit board or any other suitable substrate to which it is desired to transfer an image.

In the present invention, the image is generated in the image-forming layer of the image-donating element by removing the background areas by the technique of laser-induced thermal ablation. In carrying out such technique, a laser that emits in the infrared region is used and the image-forming layer must be sufficiently infrared-absorptive to bring about imagewise-generation of heat sufficient to remove the background areas by thermal ablation. Such use of a laser renders it feasible to obtain the high degree of image resolution needed for lithographic printing plates. The action of the laser effectively removes the image-forming layer, and any overlying adhesive layer or underlying release layer, so as to reveal the support in the background areas. Lamination is carried out by the use of conventional laminators, such as those employing heated pressure rolls, and the peeling step removes the support so that the entire image is cleanly transferred to the image-receiving element and bonds strongly thereto.

The invention is especially advantageous in the manufacture of lithographic printing plates since it eliminates the need for a developing solution. Moreover, it is capable of providing a durable oleophilic image, hydrophilic non-image areas that are highly resistant to scratching or other damage and excellent discrimination between the oleophilic image areas and the hydrophilic non-image areas which provides a high quality lithographic printing surface. Further advantages of the invention include the fact that it is capable of utilizing conventional lithographic substrates, such as grained and anodized aluminum, that it is readily adapted to use with conventional low cost laminating equipment, and that it is readily adapted to use with conventional imaging devices that employ infrared lasers including both sheet-fed and roll-fed devices. Effective utilization of the process in the manufacture of lithographic printing plates utilizing aluminum supports is predicated on the fact that the transferred image bonds strongly to the porous wear-resistant hydrophilic surface of anodized aluminum.

DETAILED DESCRIPTION OF THE INVENTION

Key aspects of the present invention include the use of an image-donating element which employs a temporary support from which the image can be easily removed and an image-receiving element which is of such a nature that the image can be strongly bonded thereto.

As hereinabove described, the essential components of the image-donating element are a support and an image-forming layer which is infrared-absorptive. The image-donating element can also optionally include one or both of a release layer and an adhesive layer which are hereinafter described in detail.

The support for the image-donating element can be any suitable support on which an infrared-absorptive image-forming layer can be coated. Preferred supports are flexible polymeric films. Examples of suitable support materials include polyethylene terephthalate, polyethylene naphthalate, poly-1,4-cyclohexanedimethylene terephthalate, polyvinyl chloride, polyimide, polycarbonate, polystyrene, cellulose acetate, cellulose acetate propionate, cellulose acetate butyrate, and the like. To provide control of adhesion, the support can be surface treated by various processes including corona discharge, glow discharge, UV exposure or solvent washing or can be overcoated with polymers such as vinylidene chloride containing copolymers, butadiene-based copolymers, glycidyl acrylate or methacrylate containing copolymers or maleic anhydride containing copolymers.

The support thickness is typically in the range of from about 0.004 to about 0.4 millimeters and more preferably about 0.02 to about 0.2 millimeters.

The image-forming layer utilized in this invention typically has a thickness in the range of from about 0.0002 to about 0.02 millimeters and more preferably in the range of from about 0.0005 to about 0.002 millimeters. The key requirement for this layer is that it be infrared-absorptive and thus capable of being imaged by exposure to a laser which emits in the infrared.

The image-forming layer is conveniently prepared by coating the support with a coating composition comprising a film-forming polymeric binder and an infrared absorber. Examples of suitable film-forming polymeric binders include cellulosic polymers such as nitrocellulose, hydroxyethyl cellulose and cellulose acetate propionate; polyurethanes; polycarbonates such as bisphenol-A polycarbonate; acrylates such as poly(methyl methacrylate) and polycyanoacrylate; polyesters; poly(vinyl acetate); polyacetals such as poly(vinyl butyral) and poly(vinyl alcohol-co-butyral) and styrenes such as poly(α-methylstyrene).

A wide range of infrared absorbers suitable for use in elements which employ laser-induced thermal ablation are known in the art and described in numerous patents such as for example, U.S. Pat. Nos. 4,912,083, 4,942,141, 4,948,776, 4,948,777, 4,948,778, 4,950,639, 4,950,640, 4,952,552, 4,973,572 and 5,036,040. Any of these infrared absorbers can be used in the present invention.

Incorporation of an infrared absorber in the imaging layer in an appropriate concentration renders it sensitive to infrared radiation and capable of generating a high resolution image by imagewise laser-induced thermal ablation. The infrared absorber can be a dye or pigment. A very wide range of such compounds is well known in the art and includes dyes or pigments of the squarylium, croconate, cyanine, merocyanine, indolizine, pyrylium and metal dithiolene classes.

Additional infrared absorbers that are of utility in this invention include those described in U.S. Pat. No. 5,166,024, issued Nov. 24, 1992. As described in the '024 patent, particularly useful infrared absorbers are phthalocyanine pigments.

Examples of preferred infrared-absorbing dyes for use in this invention are the following:

IR-1
___

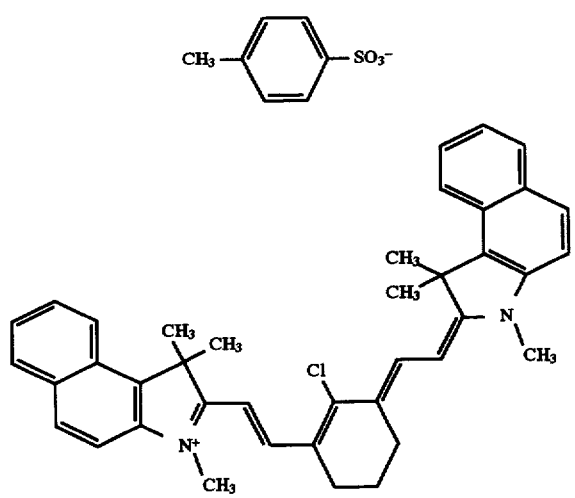

2-[2-[2-chloro-3-[(1,3-dihydro-1,1,3-trimethyl-2H-benz[e]indol-2-ylidene)ethylidene-1-cyclohexe-1-yl]ethenyl]-1,1,3-trimethyl-1H-benz[e]indolium salt with 4-methylbenzenesulfonic acid

IR-2
___

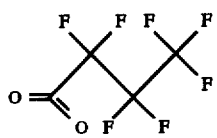

2-[2-[2-chloro-3-[(1,3-dihydro-1,1,3-trimethyl-2H-benz[e]indol-2-ylidene)ethylidene-1-cyclohexe-1-yl]ethenyl-1,1,3-trimethyl-1H-benz[e]indolium salt with heptafluorobutyrate

IR-3
___

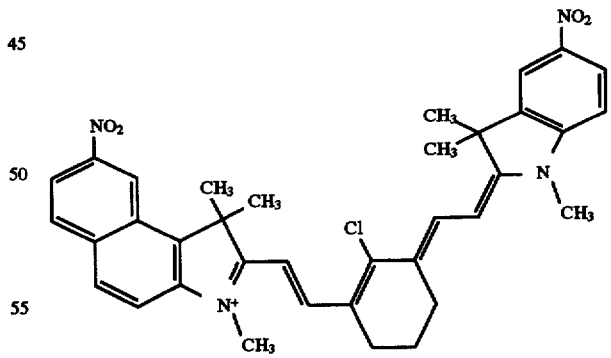

2-(2-(2-chloro-(3-(1,3-dihydro-1,3,3-trimethyl-5-nitro-2H-indol-2-ylidene)ethylidene)-1-cyclohexene-1-yl)ethenyl)-1,3,3-trimethyl-5-nitro-3H-indolium hexafluorophosphate

IR-4

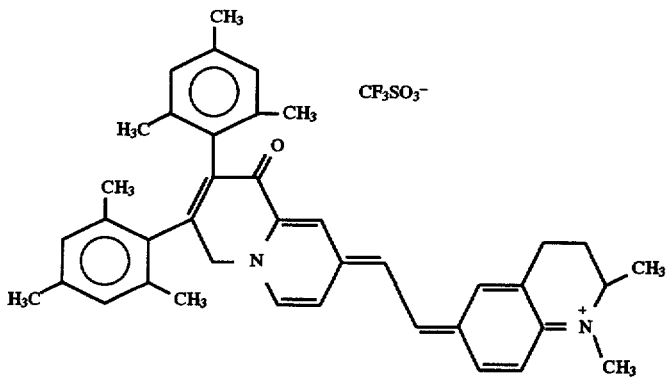

2,3,4,6-tetrahydro-1,2-dimethyl-6-[[1-oxo-2,3-bis(2,4,6-trimethylphenyl)-7(1H)-indolizinylidene]ethylidene] quinolinium trifluoromethanesulfonate.

The image-forming layer of the image-donating element utilized in this invention is typically prepared, as described hereinabove, by dispersing an infrared absorbing agent in a film-forming polymeric binder. This is not the only way of meeting the requirements of this invention however. Thus, an alternative to use of an infrared-absorbing agent dispersed in a polymeric film-forming binder is to use a film-forming polymer having substituent groups on the polymer chain which are infrared absorbing.

Ingredients which can be optionally included in the image-forming layer utilized in this invention include colorants, such as visible dyes, ultraviolet dyes, organic pigments or inorganic pigments, which render the layer colored and thus make it easier to determine if there are any coating defects.

When the imaging method of this invention is used in the preparation of a lithographic printing plate, it is necessary for the image-forming layer to be both oleophilic and infrared-absorptive so that the image transferred to the image-receiving element will be oleophilic and thus capable of accepting ink. Thus, it is necessary to select an appropriate film-forming polymeric binder which provides oleophilic properties. It is also necessary that the surface of the image-receiving element to which the image is transferred be hydrophilic and thus capable of accepting water. As previously indicated herein, a preferred image-receiving element is an anodized aluminum material in which the anodic oxide layer serves as a hydrophilic surface. Thus, the lithographic printing surface formed by image transfer is oleophilic in the image areas and hydrophilic in the background areas, as required for lithographic printing.

When the method of this invention is used for manufacture of lithographic printing plates, dyes incorporated in the image-forming layer should not be soluble in printing ink, since such solubility will result in contamination of the ink and a reduction in structural integrity of the image which can result in wear failure of the printing plate.

In the method of this invention, it is preferred to provide a release layer which is interposed between the support and the image-forming layer of the donor element and which serves to facilitate peeling of the support from the image after the lamination step. A suitable thickness for the release layer is in the range of from about 0.05 to about 1 micrometer. In forming a release layer, any suitable material can be used which exhibits marginal adhesion to the overlying image-forming layer.

A preferred class of polymers for use in forming a release layer in the donor elements of this invention are poly(alkyl cyanoacrylates) such as poly(methyl-2-cyanoacrylate) or poly(ethyl-2-cyanoacrylate).

In addition to a polymer which provides suitable release properties, the release layer can contain an infrared absorber to help in providing optimum cleanout in the background areas by the step of laser-induced thermal ablation. If the release layer is completely removed, along with the image-forming layer, in the areas which are ablated then there is no risk of material from the release layer being transferred to the image-receiving element and causing unwanted pick-up of ink.

Improved release characteristics can be achieved by incorporating in the release layer a fluorinated compound. A particularly suitable material for this purpose is a mixture of fluoroaliphatic polymeric esters available from Minnesota Mining and Manufacturing Company as FLUORAD FC-431. Use of such fluorinated materials facilitates the step of peeling after lamination.

In the method of this invention, it is preferred to provide an adhesive layer which overlies the image-forming layer of the donor element and which serves to enhance the bonding of the image to the image-receiving layer. A suitable thickness for the adhesive layer is in the range of from about 0.05 to about 1 micrometer.

A wide variety of polymeric materials can be used to form a suitable adhesive layer including, for example, poly(vinyl butyral) and copolymers of ethylene and ethyl acrylate. Preferred polymeric materials for use in the adhesive layer are those which have a low glass transition temperature, such as a glass transition temperature of 150° C. or less.

In the background areas, the adhesive layer is removed, along with the image-forming layer and any release layer, by the step of laser-induced thermal ablation. In the image areas, the adhesive layer transfers with the image and functions to improve adhesion to the surface of the image-receiving element.

In a particular embodiment of the invention, the donor element utilizes a two-layer ablative system in that a suitable ablative layer, such as a metal thin film, is coated directly beneath the image-forming layer. In this system the donor element is imaged from the backside and the metal thin film or similar layer is absorptive of the radiation emitted by the laser and is ablated by the action of the laser beam, thereby causing the material in the regions which are exposed to be ejected from the image-forming layer. The metal thin film or other equivalent absorptive layer is referred to herein as "an auxiliary ablative layer." Two-layer ablative systems and the manner in which they function are well known in the art and are described, for example, in U.S. Pat. No. 5,171,650.

In utilizing the method of this invention to prepare a lithographic printing plate, it is preferred to use as the image-receiving element an anodized aluminum support of the type which is widely used in conventional lithographic printing plates. Examples of such supports include aluminum which has been anodized without prior graining, aluminum which has been grained and anodized, and aluminum which has been gained, anodized and coated with a hydrophilic barrier layer such as a silicate layer. Other hydrophilic support materials in addition to anodized aluminum can, of course, be used if desired. An anodized aluminum support is preferred because of its affinity for the fountain solution used on a printing press and because it is extremely wear-resistant. Particularly preferred is an aluminum plate which has been both grained and anodized.

In utilizing the method of this invention to prepare printed circuit boards, the image-receiving element can be any metal or metal-coated substrate such as is conventionally employed in printed circuit board manufacture.

Whether or not an adhesive layer is employed in the practice of this invention, the image must form a bond with the surface of the image-receiving element which is stronger than the bond between the image and its support so that the support can be readily peeled away after the lamination step.

In the method of this invention, the image is generated by a step of imagewise laser-induced thermal ablation of the image-forming layer. Typically, such step requires an energy input in the range of from about 300 to about 1400 millijoules per square centimeter (mJ/cm$^2$). Suitable apparatus for carrying out the laser-induced thermal ablation is well known in the art. An example of such apparatus is the thermal print engine described in Baek and DeBoer, U.S. Pat. No. 5,168,288, the disclosure of which is incorporated herein by reference. Removal of the ablated material can be carried out by suitable suction devices well known in the art.

In the method of this invention, the laser energy applied is sufficient to cause the material in the regions which are exposed to be ejected from the image-forming layer, thereby revealing the underlying support.

Following generation of the image by laser-induced thermal ablation of the imaging layer, the method of this invention is completed by the steps of laminating and peeling.

The laminating unit used to carry out the laminating step in the method of this invention can be any suitable device which provides the necessary heat and pressure to transfer the image from the donor element to the receiver element. Most typically, heated pressure rollers are used to carry out the lamination. Suitable laminating devices are described, for example, in U.S. Pat. Nos. 4,659,927 and 5,075,722.

A suitable transport speed in the laminator is a speed in the range of from about 0.5 to about 10 centimeters per second. Typical temperatures in the roller nip at the point where lamination occurs are in the range of from about 100° C. to about 350° C.

The laminating unit can be designed for automatic peeling or, to simplify construction and reduce costs, can rely on manual peeling that is performed by the operator. To facilitate manual peeling, a leader strip which can be gripped by the operator can be adhered to the donor element.

The invention is further illustrated by the following examples of its practice.

EXAMPLE 1

A donor element was prepared by coating a 100-micrometer thick polyethylene terephthalate film with, in order, a release layer, an image-forming layer and an adhesive layer. The release layer, which was coated from acetonitrile, comprised 0.38 g/m$^2$ of poly(methyl-2-cyanoacrylate), 0.05 g/m of infrared-absorbing dye IR-1 and 0.003 g/m$^2$ of FLUORAD FC-431. The image-forming layer, which was coated from methyl isobutyl ketone, comprised 0.60 g/m$^2$ of nitrocellulose (1000–1500 second viscosity), 0.22 g/m$^2$ of infrared absorbing dye IR-1, 0.13 g/m$^2$ of a UV-absorbing dye of the formula:

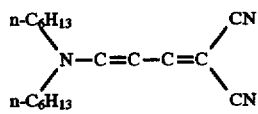

0.28 g/m$^2$ of a yellow dye of the formula:

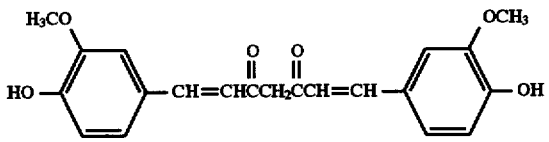

and 0.16 g/m$^2$ of a cyan dye of the formula:

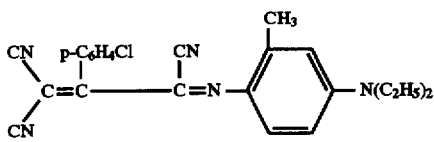

The adhesive layer was comprised of 0.22 g/m$^2$ of a poly(vinyl butyral) available from Monsanto Corporation under the trademark BUTVARB-76.

An image was formed by laser-induced thermal ablation of the image-forming layer using an infrared laser exposing device of the type described in U.S. Pat. No. 5,168,288. The imaging step was carried out with the use of ten 700-mWatt lasers with an average power of 400 mWatt at the focal plane. The 53-cm drum of the laser printer assembly was rotated at 200 rpm to provide an energy input of 508.5 mJ/cm$^2$. As a result of the laser exposure, the exposed region was cleaned out down to the support.

After image formation, the donor element was placed in contact with an aluminum sheet material that had been electrolytically grained and anodized and fed through a LAMINEX Model PAK IV laminator at 160° C. at a feed rate of approximately 1.14 m/min. The polyethylene terephthatate support was then peeled off, leaving the image securely bonded to the anodized surface of the aluminum plate.

The printing plate was mounted on an A. B. Dick 360 Model 9870 press and employed to print one thousand impressions. Print quality was consistently good throughout the run.

EXAMPLE 2

Example 1 was repeated using an adhesive layer composed of 0.05 g/m$^2$ of BUTVARB-76. Good transfer to the anodized aluminum sheet material was achieved.

EXAMPLE 3

Example 1 was repeated using an adhesive layer composed of 0.05 g/m$^2$ of a thermal adhesive available commercially from EMHART CORPORATION under the trademark BOSTIK 7962 adhesive. Good transfer to the anodized aluminum sheet material was achieved.

EXAMPLE 4

A donor element was prepared by coating a 25 micrometer thick polyethylene terephthalate film with a release layer and an image-forming layer. The release layer was the same as that described in Example 1. The image-forming layer comprised 0.60 g/m$^2$ of nitrocellulose (1000–1500 second viscosity); 0.22 g/m$^2$ of infrared-absorbing dye IR-1; 0.17 g/m$^2$ of a UV-absorbing dye of the formula:

0.28 g/m$^2$ of a yellow dye of the formula:

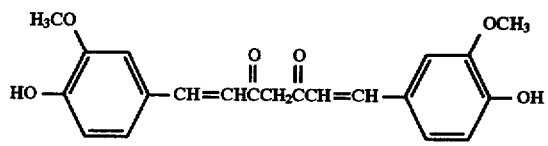

and 0.38 g/f$^2$ of a cyan dye of the formula:

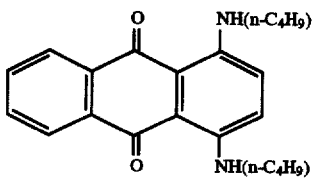

A lithographic printing plate was prepared in the same manner as described in Example 1 except that the laminator temperature was 200° C., and similar results to those of Example 1 were obtained.

EXAMPLE 5

Example 4 was repeated except that the donor element was provided with an adhesive layer composed of 0.11 g/m$^2$ of BUTVAR B-76. Similar results were obtained.

EXAMPLE 6

Example 4 was repeated except that the donor element was provided with an adhesive layer composed of 0.22 g/m$^2$ of BOSTIK 7962. Similar results were obtained.

EXAMPLE 7

Example 4 was repeated except that the donor element was provided with an adhesive layer composed of 0.09 g/m$^2$ of an ethylene/ethyl acrylate copolymer with a molecular weight of approximately 171000. Similar results were obtained.

EXAMPLE 8

Example 4 was repeated except that the donor element was provided with an adhesive layer composed of 0.09 g/m$^2$ of an ethylene/ethyl acrylate copolymer with a molecular weight of approximately 151500. Similar results were obtained.

The method of this invention provides many important advantages in comparison with the prior art. Thus, for example, it permits the preparation of a high quality lithographic printing plate without the need to employ alkaline developing solutions and thus is highly advantageous from an environmental standpoint. The printing plates produced by the method of this invention exhibit excellent discrimination between oleophilic image areas and hydrophilic non-image areas and excellent durability which facilitates long press runs. In the method of this invention, the donor element can be flexible and thus capable of being wrapped around a drum to facilitate imagewise exposure yet the image can be transferred to substrates as rigid as a printed circuit board. Readily available materials, such as grained and anodized aluminum, can be used as the receiver element and readily-available low-cost laminating equipment can be used in carrying out the lamination and peeling steps required by the method.

The invention has been described in detail, with particular reference to certain preferred embodiments thereof, but it should be understood that variations and modifications can be effected within the spirit and scope of the invention.

We claim:

1. A method for preparation of a lithographic printing plate from separate image-donating and image-receiving elements; said method comprising the steps of:
   (1) providing a first element which serves as an image-donating element, said first element comprising a support and an image-forming layer which is both oleophilic and infrared-absorptive, and a release layer interposed between said support and said image-forming layer, said release layer functioning to facilitate peeling of said support from said image-forming layer after image transfer;
   (2) providing a second element which serves as an image-receiving element, said second element having a hydrophilic surface;
   (3) generating an image on said first element by imagewise infrared-laser-induced thermal ablation of said image-forming layer and said release layer; and thereafter
   (4) transferring said image from said first element to said hydrophilic surface of said second element by the steps of contacting and laminating said first element to said hydrophilic surface of said second element and subsequently peeling said first element from said second element; the degree of infrared-absorptivity of said image-forming layer being sufficient for an infrared-emitting laser to carry out said thermal ablation and said image forming a bond with said hydrophilic surface which is stronger than the bond between said image and said support so that said support can be peeled away after said lamination step.

2. A method as claimed in claim 1, wherein said first element additionally comprises an adhesive layer overlying said image-forming layer.

3. A method as claimed in claim 2, wherein said adhesive layer comprises a polymer of ethylene and ethyl acrylate.

4. A method as claimed in claim 1, wherein said step of laser-induced thermal ablation employs an energy input in the range of from about 300 to about 1400 mJ/cm$^2$.

5. A method as claimed in claim 1, wherein said first element additionally includes an auxiliary ablative layer beneath said image-forming layer.

6. A method as claimed in claim 1, wherein said support is a flexible polymeric film.

7. A method as claimed in claim 1, wherein said support is a polyethylene terephthalate film.

8. A method as claimed in claim 1, wherein said support has a thickness in the range of from about 0.004 to about 0.4 millimeters.

9. A method as claimed in claim 1, wherein said image-forming layer has a thickness in the range of from about 0.0002 to about 0.02 millimeters.

10. A method as claimed in claim 1, wherein said image-forming layer comprises a film-forming polymeric binder and an infrared absorber.

11. A method as claimed in claim 10, wherein said infrared absorber is an infrared-absorbing dye.

12. A method as claimed in claim 1, wherein said image-forming layer comprises nitrocellulose and an infrared absorber.

13. A method as claimed in claim 1, wherein said image-forming layer comprises a film-forming polymer having substituent groups on the polymer chain which are infrared absorbing.

14. A method as claimed in claim 1, wherein said image-receiving element is comprised of grained and anodized aluminum.

15. A method as claimed in claim 1, wherein said release layer comprises a poly(alkyl cyanoacrylate).

16. A method as claimed in claim 1, wherein said release layer comprises an infrared absorber.

17. A method as claimed in claim 2, wherein said adhesive layer comprises polyvinyl butyral.

18. A method as claimed in claim 1, wherein said lamination step is carried out with the use of heated pressure rollers.

19. A method as claimed in claim 1, wherein said lamination and peeling steps are carried out by means of apparatus that laminates and then automatically peels.

20. A method as claimed in claim 1, wherein said peeling step is a manual peeling step.

21. A method for the preparation of a lithographic printing plate from separate image-donating and image-receiving elements; said method comprising the steps of:

(1) providing a first element which serves as an image-donating element, said first element comprising a support having coated, in order, thereon a release layer, an image-forming layer and an adhesive layer, said release layer functioning to facilitate peeling of said support from said image-forming layer after image transfer, and said image-forming layer being both oleophilic and infrared-absorptive;

(2) providing a second element which serves as an image-receiving element, said second element being a grained and anodized aluminum sheet, (3) generating an image on said first element by image-wise infrared-laser-induced thermal ablation of said image-forming layer, said release layer and said adhesive layer; and thereafter (4) transferring said image from said first element to said grained and anodized aluminum surface of said second element by the steps of contacting and laminating said first element to said grained and anodized aluminum surface of said second element and subsequently peeling said first element from said second element; the degree of infrared-absorptivity of said image-forming layer being sufficient for an infrared-emitting laser to carry out said thermal ablation and said image forming a bond with said grained and anodized aluminum surface which is stronger than the bond between said image and said support so that said support can be peeled away after said lamination step.

22. A method for the preparation of a lithographic printing plate from separate image-donating and image-receiving elements; said method comprising the steps of:

(1) providing a first element which serves as an image-donating element, said first element comprising a poly- ethylene terephthalate film support having coated, in order, thereon a release layer, an oleophilic and infrared-absorptive image-forming layer and an adhesive layer; said release layer comprising poly(methyl-2-cyanoacrylate) and functioning to facilitate peeling of said support from said image-forming layer after image transfer, said image-forming layer comprising nitrocellulose and an infrared absorber, and said adhesive layer comprising polyvinyl butyral;

(2) providing a second element which serves as an image-receiving element, said second element being a grained and anodized aluminum sheet, (3) generating an image on said first element by image-wise infrared-laser-induced thermal ablation of said image-forming layer, said release layer and said adhesive layer; and thereafter (4) transferring said image from said first element to said grained and anodized aluminum surface of said second element by the steps of contacting and laminating said first element to said grained and anodized aluminum surface of said second element and subsequently peeling said first element from said second element; the degree of infrared-absorptivity of said image-forming layer being sufficient for an infrared-emitting laser to carry out said thermal ablation and said image forming a bond with said grained and anodized aluminum surface which is stronger than the bond between said image and said support so that said support can be peeled away after said lamination step.

23. A method for preparation of an imaging element from separate image-donating and image-receiving elements; said method comprising the steps of:

(1) providing a first element which serves as an image-donating element, said first element comprising a support, an image-forming layer which is infrared-absorptive and a release layer interposed between said support and said image-forming layer, said release layer functioning to facilitate peeling of said support from said image-forming layer after image transfer;

(2) providing a second element which serves as an image-receiving element;

(3) generating an image on said first element by image-wise infrared-laser-induced thermal ablation of said image-forming layer and said release layer; and thereafter (4) transferring said image from said first element to said second element by the steps of contacting and laminating said first element to said second element and subsequently peeling said first element from said second element; the degree of infrared-absorptivity of said image-forming layer being sufficient for an infrared-emitting laser to carry out said thermal ablation and said image forming a bond with the surface of said second element which is stronger than the bond between said image and said support so that said support can be peeled away after said lamination step.

24. A method for preparation of an imaging element from separate image-donating and image-receiving elements; said method comprising the steps of:

(1) providing a first element which serves as an image-donating element, said first element comprising a support, an image-forming layer which is infrared-absorptive, a release layer interposed between said support and said image-forming layer, and an adhesive layer overlying said image-forming layer;

(2) providing a second element which serves as an image-receiving element;

(3) generating an image on said first element by imagewise infrared-laser-induced thermal ablation of said image-forming layer, said release layer and said adhesive layer, said release layer functioning to facilitate peeling of said support from said image-forming layer after image transfer; and thereafter (4) transferring said image from said first element to said second element by the steps of contacting and laminating said first element to said second element and subsequently peeling said first element from said second element; the degree of infrared-absorptivity of said image-forming layer being sufficient for an infrared-emitting laser to carry out said thermal ablation and said image forming a bond with the surface of said second element which is stronger than the bond between said image and said support so that said support can be peeled away after said lamination step.

* * * * *